(12) United States Patent
Huang et al.

(10) Patent No.: US 8,786,207 B2
(45) Date of Patent: Jul. 22, 2014

(54) LIGHT-EMITTING DIODE WITH ADJUSTABLE LIGHT BEAMS AND METHOD FOR CONTROLLING THE SAME

(75) Inventors: Chun-Ru Huang, Taipei (TW); Chien-Yueh Chen, Taipei (TW)

(73) Assignee: AV Tech Corporation, New Taipei (TW)

( * ) Notice: Subject to any disclaimer, the term of this patent is extended or adjusted under 35 U.S.C. 154(b) by 214 days.

(21) Appl. No.: 13/476,329

(22) Filed: May 21, 2012

(65) Prior Publication Data

US 2013/0214696 A1     Aug. 22, 2013

(30) Foreign Application Priority Data

Feb. 16, 2012   (TW) .............................. 101105160 A

(51) Int. Cl.
    *H05B 37/02*     (2006.01)
(52) U.S. Cl.
    USPC .......................................... 315/291; 315/324
(58) Field of Classification Search
    None
    See application file for complete search history.

(56) References Cited

U.S. PATENT DOCUMENTS

| | | | |
|---|---|---|---|
| 6,384,492 B1* | 5/2002 | Iversen et al. ................. | 307/147 |
| 6,646,388 B2* | 11/2003 | George et al. .............. | 315/169.3 |
| 7,183,582 B2* | 2/2007 | Imamura ......................... | 257/88 |
| 8,436,549 B2* | 5/2013 | Hasnain ........................ | 315/291 |
| 8,624,505 B2* | 1/2014 | Huang ........................... | 315/152 |
| 2011/0204807 A1* | 8/2011 | Hashizume et al. .......... | 315/246 |
| 2011/0291564 A1* | 12/2011 | Huang ............................. | 315/77 |
| 2012/0038286 A1* | 2/2012 | Hasnain ........................ | 315/250 |
| 2012/0038291 A1* | 2/2012 | Hasnain ........................ | 315/294 |
| 2012/0062205 A1* | 3/2012 | Levesque et al. .............. | 323/318 |
| 2012/0223657 A1* | 9/2012 | Van de Ven ..................... | 315/297 |

\* cited by examiner

*Primary Examiner* — Crystal L Hammond
(74) *Attorney, Agent, or Firm* — Wang Law Firm, Inc.; Li K. Wang; Stephen Hsu

(57) ABSTRACT

A light-emitting diode with adjustable light beams and a method for controlling the same. The light-emitting diode includes a substrate, multiple dies on the substrate, a primary optical lens over the substrate, wherein a portion of the dies being designated as belonging to a first group of dies and another portion of the dies being designated as belonging to a second group of dies, the primary optical lens covers the dies, and a controlling unit selectively drives the first or the second group to emit light, wherein a light beam formed by light that is emitted by the first group and passes through the primary optical lens has a different shape or projection angle from a light beam formed by light that is emitted by the second group and passes through the primary optical lens.

12 Claims, 10 Drawing Sheets

LIGHT-EMITTING DIODE WITH ADJUSTABLE LIGHT BEAMS AND METHOD FOR CONTROLLING THE SAME

CROSS-REFERENCE TO RELATED APPLICATION

This application claims the benefit of Taiwan Patent Application No. 101105160, filed on Feb. 16, 2012, in the Taiwan Intellectual Property Office, the disclosure of which is incorporated herein in its entirety by reference.

BACKGROUND OF THE DISCLOSURE

1. Field of the Disclosure

The present invention relates to a light emitting device, and more particularly, to a light emitting device with adjustable light beams.

2. Brief Description of the Related Art

Recently, light-emitting diodes (LED) have been widely used in light sources for mobile phones, liquid-crystal-display panels, illuminating devices and household articles. Light-emitting diodes have advantages of high lighting efficiency, long life spans, difficulty to break, directional lights, adjustable light intensity, small volume and high flexibility to be applied to various products.

However, conventional light-emitting diodes have multiple disadvantages. For example, a directional light emitted by a light-emitting diode cannot be freely adjusted in shapes and projection angles, and therefore, limits to applications in use. Beside, a camera or other products assembled with the conventional light-emitting diode could have the vignetting effect or flashlight effect. Accordingly, the present invention provides a light-emitting diode with adjustable light projection angles and light shapes, and the vignetting effect or the flashlight effect can be solved.

SUMMARY OF THE DISCLOSURE

In order to improve the above-mentioned problems of prior art, the present invention is directed to a light-emitting diode with adjustable light beams for solving the problems that the light projection angle of the conventional light-emitting diode cannot be adjusted and the vignetting effect easily happens.

The present invention proposes a light-emitting diode with adjustable light beams. The light-emitting diode includes a substrate, multiple dies on the substrate, a primary optical lens over the substrate, wherein a portion of the dies being designated as belonging to a first group of dies and another portion of the dies being designated as belonging to a second group of the dies, the primary optical lens covers the dies, and a controlling unit selectively drives the first or the second group of the dies to emit light, wherein a light beam formed by light that is emitted by the first group of the dies passing through the primary optical lens has a different shape or projection angle from a light beam formed by light that is emitted by the second group of the dies passing through the primary optical lens.

The present invention proposes a method for controlling light beams of a light-emitting diode. The method includes the following steps: providing a substrate; providing multiple dies on the substrate, wherein a portion of the dies being designated as belonging to a first group of dies and another portion of the dies being designated as belonging to a second group of the dies; providing a primary optical lens on the substrate, wherein the primary optical lens covers the dies; and selectively drives the first or the second group of the dies to emit light by a controlling unit, wherein a light beam formed by light that is emitted by the first group of the dies passing through the primary optical lens has a different shape or projection angle from a light beam formed by light that is emitted by the second group of the dies passing through the primary optical lens.

In one embodiment, the first group of dies is disposed at the center of the substrate, and the second group of the dies is arranged in the ring enclosing the first group of the dies in the concentric manner.

In one embodiment, the dies are arranged in a rectangular shape, wherein the first group of the dies is disposed at a center of the substrate, and the second group of the dies is arranged in a ring enclosing the first group.

In one embodiment, the light beam formed by the light that is emitted by the second group of the dies and passes through the primary optical lens has a projection angle greater than that of the light beam formed by the light that is emitted by the first group and passes through the primary optical lens.

In one embodiment, the controlling unit controls the light intensities of the dies so as to adjust the light effect of the light-emitting diode.

In accordance with the present invention, the light-emitting diode with adjustable light beams has the following advantages of:

(1) In accordance with the present invention, the light-emitting diode has adjustable light shapes based on demand and thus various light effects of the light-emitting diode can be achieved.

(2) In accordance with the present invention, the dies included in the light-emitting diode are multiple, and thus the vignetting effect or the flashlight effect can be improved when the light-emitting diode is applied to a camera or other electronic device.

(3) In accordance with the present invention, the light-emitting diode has adjustable light projection angles and thus is flexible in use.

The accompanying drawings are included to provide a further understanding of the invention, and are incorporated as a part of this specification. The drawings illustrate embodiments of the invention and, together with the description, serve to explain the principles of the invention.

DETAILED DESCRIPTION OF THE INVENTION

Figure 1A:
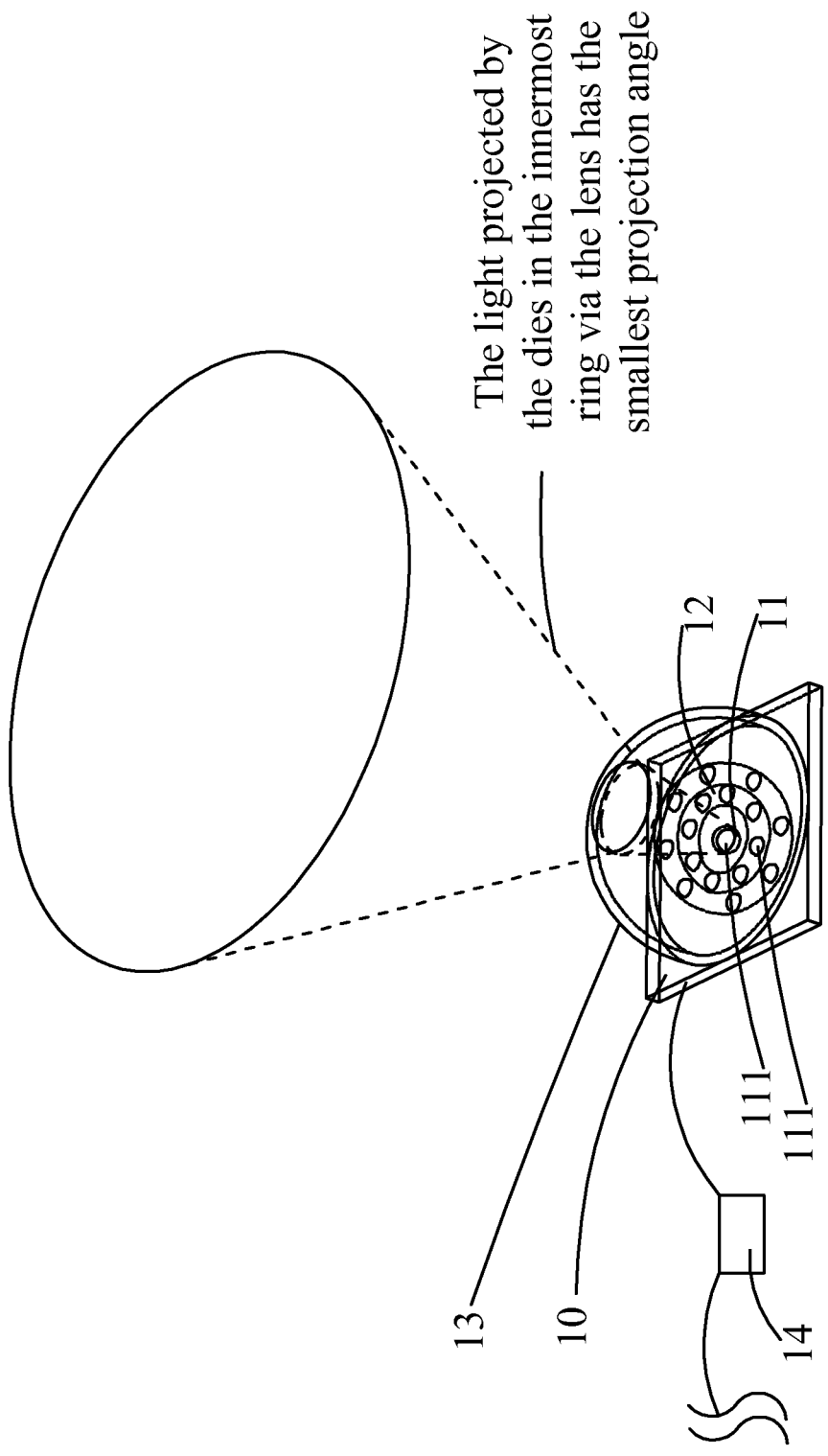
FIGS. 1A, 1B, 1C and 1D are schematic views of a light-emitting diode with adjustable light beams in accordance with a first embodiment of the present invention.

Illustrative embodiments accompanying with figures are now described below to show the characteristics, contents, advantages and effects of the invention. Figures are illustrated only for explanation, but are not drawn to scale and precise arrangement, and thus the scope of the invention should not be limited by the scale and arrangement illustrated in the figures.

Following illustration accompanying with figures is embodiments for describing a light-emitting diode with adjustable light beams. In the following embodiments, same elements are indicated by same reference numbers.

FIGS. 1A-1D are schematic views of a light-emitting diode with adjustable light beams in accordance with a first embodiment of the present invention. Referring to FIGS. 1A-1D, a light-emitting diode 1 with adjustable light beams includes a substrate 10, multiple dies 111, a primary optical lens 13 and a controlling unit 14. The first group 11 of the dies 111 is disposed at the center of the substrate 11 and includes at least one die 111. At least one second group 12 of the dies 111 is arranged in the ring enclosing the first group 11 of the dies 111 in the concentric manner and includes multiple dies 111. The primary optical lens 13 capable of concentrating light is over the substrate 10, wherein the primary optical lens 13 covers all the dies 111.

Based on the above arrangement, multiple dies for the light-emitting diode are mounted on the substrate, such as PCB board, and each group of the die can be controlled to emit light such that the light shape or light projection angle of the light-emitting diode 1 can be adjusted. The dies can be defined in multiple groups of the dies. One group may comprise several dies, and some of these dies may also belong to another group. Referring to FIG. 1A, when the first group 11 of the dies 111 at the center of the substrate 10 emits light, the light-emitting diode 1 can achieve the smallest light projection angle by means of the primary optical lens 13.

Figure 1B:
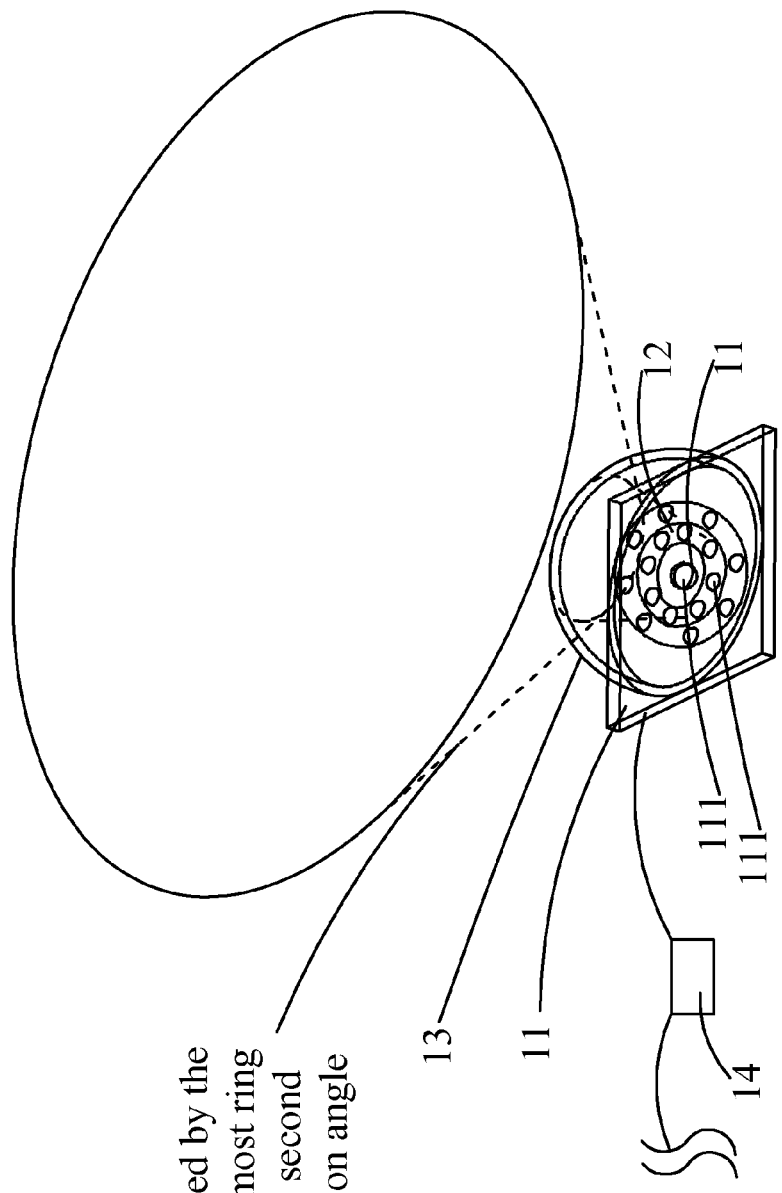
Figure 1C:
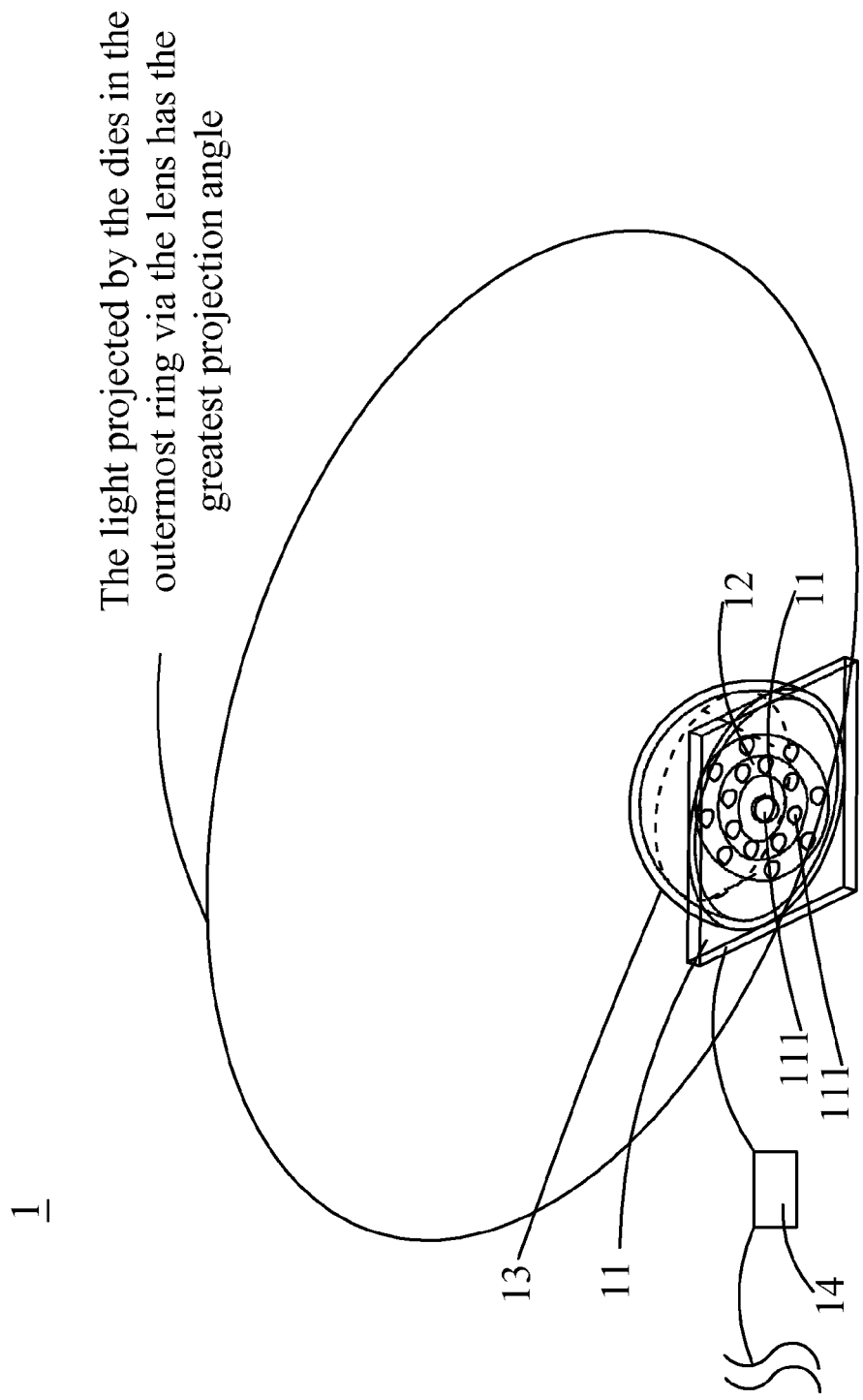

Referring to FIG. 1B, when the second group 12 of the dies 111 in the second ring emits light, the light-emitting diode 1 can achieve a greater light projection angle by means of the primary optical lens 13. Referring to FIG. 1C, when the second group 12 of the dies 111 in the third ring emit light, the light-emitting diode 1 can achieve the greatest light projection angle by means of the primary optical lens 13. The dies 111 in each of the groups can be arranged in alternate or in lines.

Figure 1D:
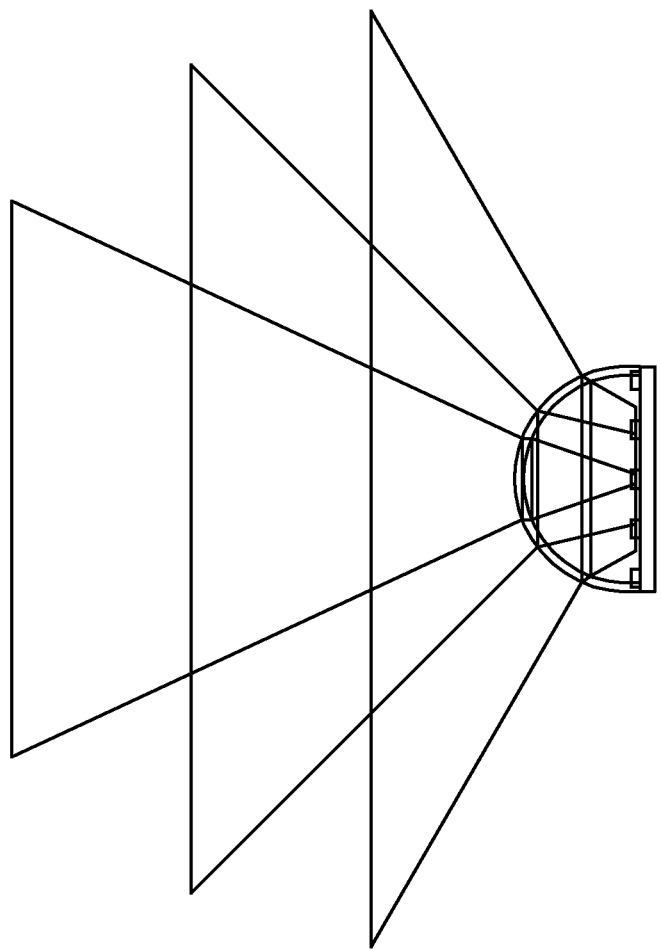

Referring to FIG. 1D, the controlling unit 14 drives the dies 111 in different groups of the dies to emit light, and thus various light projection angles can be achieved and the light-emitting diode 1 has various light effects. The arrangement in the embodiment is just for example. The groups of the dies have shapes or the numbers that can be adjusted based on demand, and the number of the dies also can be adjusted based on demand. The invention should not be limited to the arrangement.

It is noteworthy to point out that the conventional light-emitting diode cannot adjust light projection angles without the secondary optical element, which causes limitations in practice. However, in accordance with the present invention, the light-emitting diode can achieve adjustable light shapes or light projection angles just by the primary optical element, which is flexible in practice.

Besides, as being provided with a plurality of dies, the light-emitting diode according to the present invention can adjust its light shapes or light projection angles when applied to a camera or other electronic product. Also, the dies in the outer ring can be provided with enhanced brightness such that the vignetting effect and flashlight effect, happening when the conventional light-emitting diode is applied to a camera or other electronic product, can be improved. Accordingly, the present invention involves an inventive step.

Figure 2:
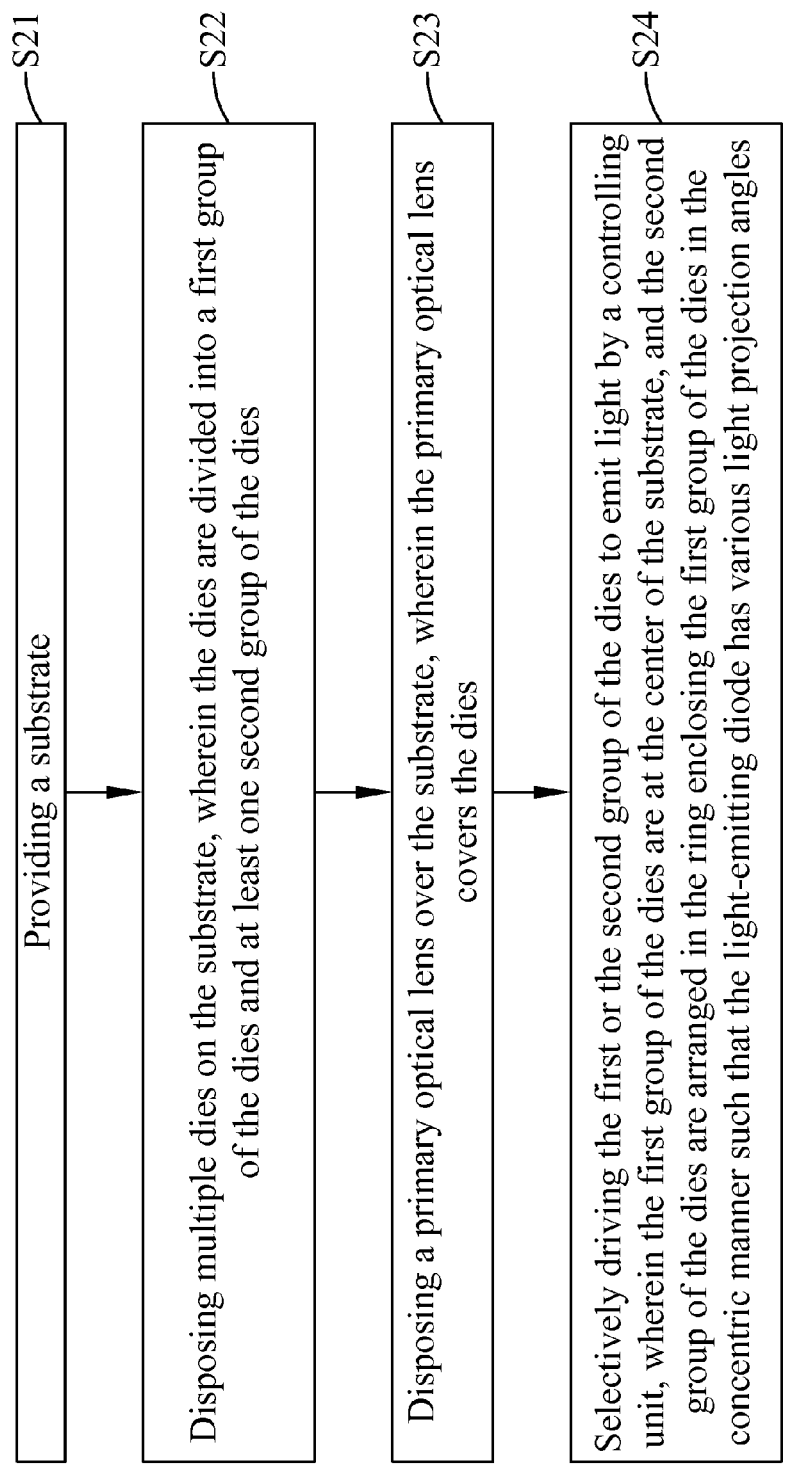
FIG. 2 is a flow chart of a light-emitting diode with adjustable light beams in accordance with a first embodiment of the present invention.

FIG. 2 is a flow chart of a light-emitting diode with adjustable light beams in accordance with a first embodiment of the present invention. Referring to FIG. 2, the embodiment includes the following steps:

Step S21 is providing a substrate;

Step S22 is disposing multiple dies on the substrate, wherein a portion of the dies being designated as belonging to a first group of the dies and another portion of the dies being designated as belonging to a second group of the dies;

Step S23 is disposing a primary optical lens over the substrate, wherein the primary optical lens covers the dies; and Step S24 is selectively driving the first or the second group of the dies to emit light by a controlling unit, wherein the first group of the dies are disposed at the center of the substrate, and the second group of the dies are arranged in the ring enclosing the first group of the dies in the concentric manner such that the light-emitting diode has various light projection angles.

Figure 3A:
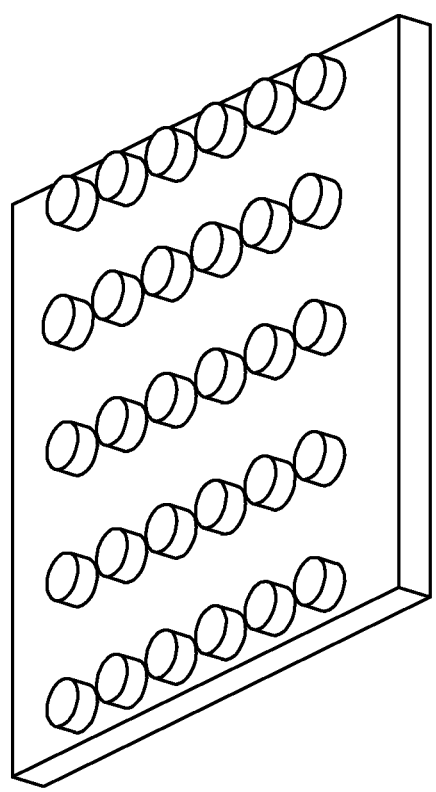
FIG. 3A and FIG. 3B are schematic views of a light-emitting diode with adjustable light beams in accordance with a second embodiment of the present invention.
Figure 3B:
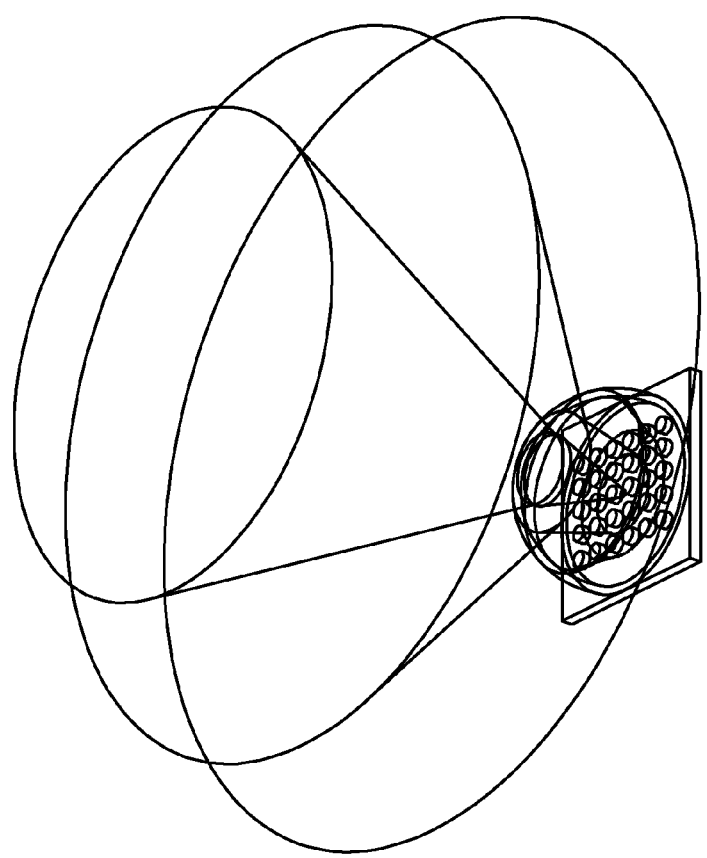

FIGS. 3A and 3B are schematic views of a light-emitting diode with adjustable light beams in accordance with a second embodiment of the present invention. As mentioned above, the light-emitting diode 3 with adjustable light beams has the dies arranged based on demand and thus can be applied to various products. The dies can be arranged in rings, a circle-like shape, a rectangle shape or other shapes based on demand. The invention should not be limited to the arrangement.

Referring to FIG. 3A, in accordance with the embodiment, the dies on the substrate are arranged in the rectangle shape. Various groups of the dies on different regions of the substrate can be selectively driven by the controlling unit such that the light-emitting diode has adjustable light projection angles.

Referring to FIG. 3B, the dies in the innermost ring emit light can achieve the smallest light projection angle. The dies in the middle ring emit light can achieve a greater light projection angle than that created by the dies in the innermost ring. The dies in the outermost ring emit light can achieve the greatest light projection angle.

Figure 4:
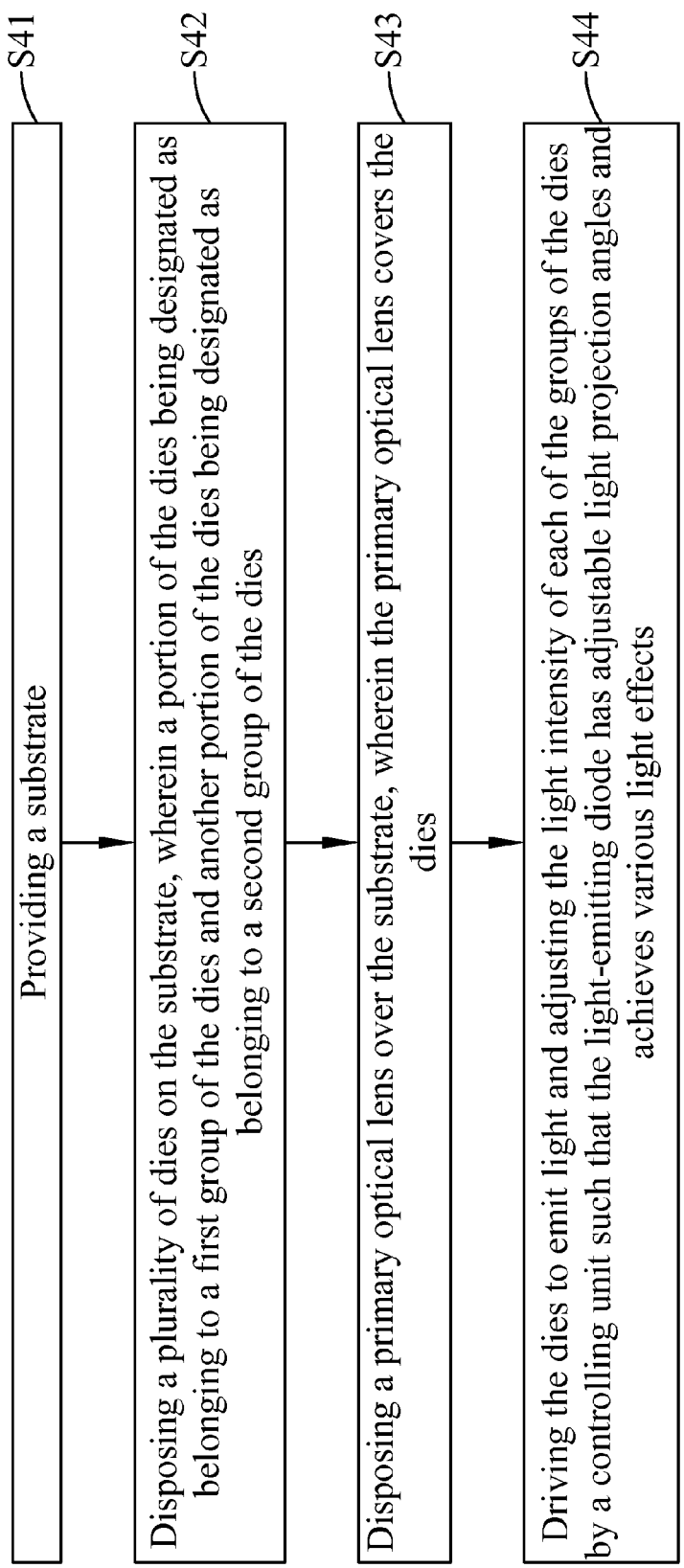
FIG. 4 is a flow chart of a light-emitting diode with adjustable light beams in accordance with a third embodiment of the present invention.

FIG. 4 is a flow chart of a light-emitting diode with adjustable light beams in accordance with a third embodiment of the present invention. Referring to FIG. 4, each of the dies of the light-emitting diode can emit light simultaneously and each of the groups of the dies has the light intensity that can be adjusted, so the light-emitting diode has adjustable light projection angles and achieves various light effects. Accordingly, the light-emitting diode can be relatively widely applied. The embodiment includes the following steps of:

Step S41 is providing a substrate;

Step S42 is disposing a plurality of dies on the substrate, a portion of the dies being designated as belonging to a first group of the dies and another portion of the dies being designated as belonging to a second group of the dies;

Step S43 is disposing a primary optical lens over the substrate, wherein the primary optical lens covers the dies; and Step S44 is driving the dies to emit light and adjusting the light intensity of each of the groups of the dies by a controlling unit such that the light-emitting diode has adjustable light projection angles and achieves various light effects.

Figure 5:
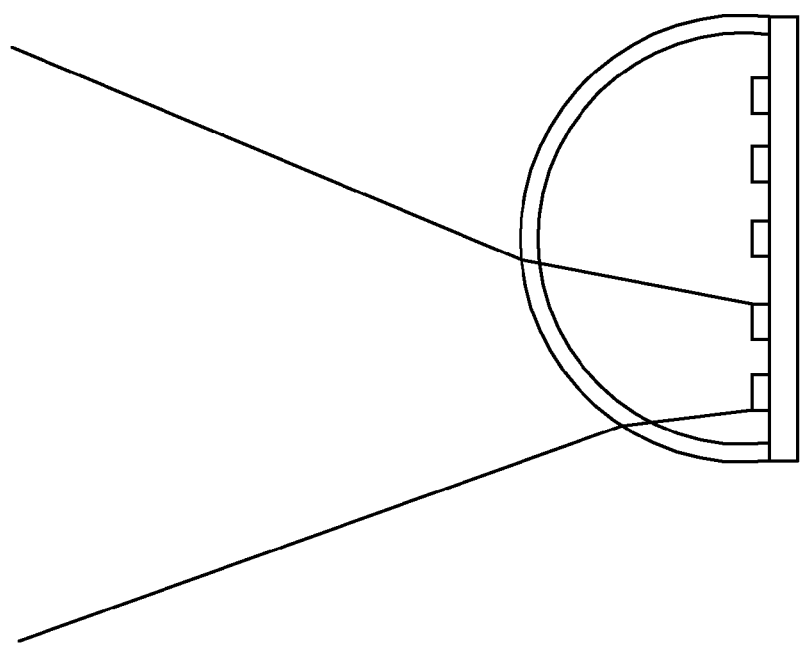
FIG. 5 is a schematic view of a light-emitting diode with adjustable light beams in accordance with a fourth embodiment of the present invention.

FIG. 5 is a schematic view of a light-emitting diode with adjustable light beams in accordance with a fourth embodiment of the present invention. Referring to FIG. 5, as mentioned above, the light-emitting diode 5 with adjustable light beams has different groups of the dies on the substrate to emit light so as to have adjustable light projection angles or light shapes. In this embodiment, light emitted by the left group of the dies on the substrate can pass through the primary optical lens to achieve a different light shape.

Accordingly, the dies in the groups of the dies may be arranged in shapes or disposed at different positions, which may change the shape and the projection angle of the light beam emitted by the light-emitting diode 5. That is to say, the light-emitting diode with adjustable light beams according to the present invention can achieve different light effects by adjusting the shape of the arrangement of the dies, the number or the position of the dies. Therefore, the present invention involves an inventive step.

Although the above description about the light-emitting diode with adjustable light beams in accordance with the present invention has illustrated the concept of the method for controlling light beams of a light-emitting diode in accordance with the present invention, the following still provides the flow chart to specify the method for controlling light beams of a light-emitting diode in accordance with the present invention.

Figure 6:
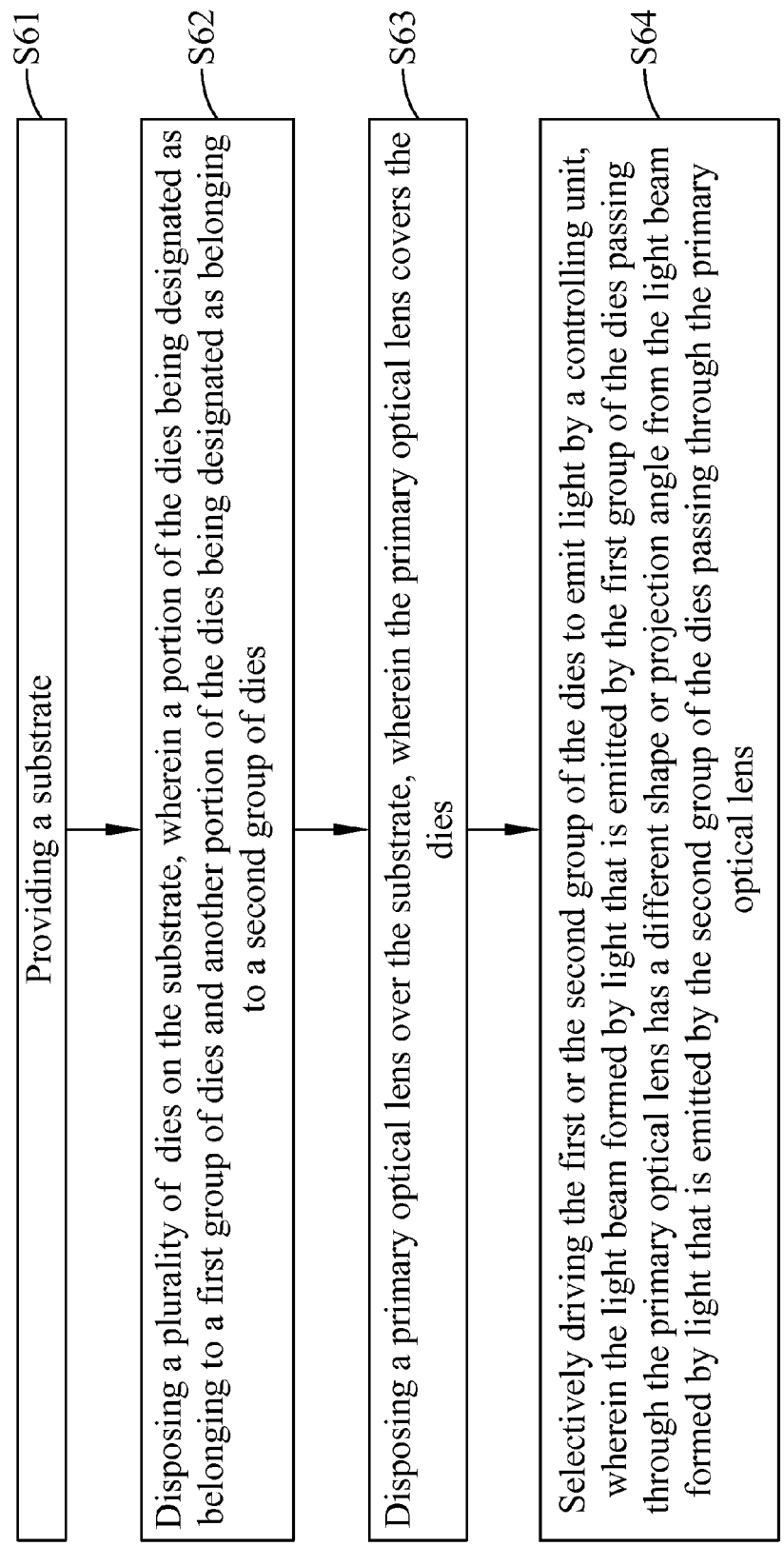
FIG. 6 is a flow chart of a method for controlling light beams of a light-emitting diode in accordance with the present invention.

FIG. 6 is a flow chart of controlling light beams of a light-emitting diode. The method includes the following steps of:

Step S61 is providing a substrate;

Step S62 is disposing multiple dies on the substrate, wherein a portion of the dies is designated as belonging to a first group of the dies and another portion of the dies is designated as belonging to a second group of the dies;

Step S63 is disposing a primary optical lens disposed on the substrate, wherein the primary optical lens covers the dies; and Step S64 is selectively driving the first or the second group of the dies to emit light by a controlling unit, wherein the light beam formed by light that is emitted by the first group of the dies passing through the primary optical lens has a different shape or projection angle from the light beam formed by light that is emitted by the second group of the diespassing through the primary optical lens.

In summation of the description above, in accordance with the present invention, the light-emitting diode has adjustable light shapes based on demand, and thus various light effects of the light-emitting diode can be achieved. The dies included in the light-emitting diode are multiple, and thus the vignetting effect or flashlight effect can be improved when the light-emitting diode is applied to a camera or other electronic device. The light-emitting diode has adjustable light projection angles and thus is flexible in use.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. A light-emitting diode with adjustable light beams, comprising:
   a substrate;
   a plurality of dies disposed on the substrate, a portion of the dies being designated as belonging to a first group of dies and another portion of the dies being designated as belonging to a second group of dies;
   a primary optical lens, disposed on the substrate and covering the first group and second group of dies; and
   a controlling unit selectively driving the first or the second group of the dies to emit light;
   wherein a light beam formed by the light that is emitted by the first group of the dies passing through the primary optical lens has a different shape or projection angle from a light beam formed by the light that is emitted by the second group of the dies passing through the primary optical lens.

2. The light-emitting diode of claim 1, wherein the first group of the dies are disposed at a center of the substrate, and the second group of the dies are arranged in a ring enclosing the first group of the dies in a concentric manner.

3. The light-emitting diode of claim 2, wherein the light beam formed by the light that is emitted by the second group of the dies and passes through the primary optical lens has a projection angle greater than that of the light beam formed by the light that is emitted by the first group of the dies and passes through the primary optical lens.

4. The light-emitting diode of claim 1, wherein the dies are arranged in a rectangular shape, the first group of the dies are disposed at a center of the substrate, and the second group of the dies are arranged in a ring enclosing the first group of the dies.

5. The light-emitting diode of claim 4, wherein the light beam formed by the light that is emitted by the second group of the dies passing through the primary optical lens has a projection angle greater than that of the light beam formed by the light that is emitted by the first group of the dies passing through the primary optical lens.

6. The light-emitting diode of claim 1, wherein the controlling unit controls light intensities of the dies so as to adjust a light effect of the light-emitting diode.

7. A method for controlling light beams of a light-emitting diode, comprising:
   providing a substrate;
   providing a plurality of dies on the substrate, a portion of the dies being designated as belonging to a first group of dies and another portion of the dies being designated as belonging to a second group of dies;
   providing a primary optical lens disposed on the substrate and covering the first group and second group of dies; and
   selectively driving the first or the second group of the dies to emit light by a controlling unit, wherein a light beam formed by light that is emitted by the first group of the dies passing through the primary optical lens has a different shape or projection angle from a light beam formed by light that is emitted by the second group of the dies passing through the primary optical lens.

8. The method of claim 7, wherein the first group of the dies are disposed at a center of the substrate, and the second group of the dies are arranged in a ring enclosing the first group of the dies in a concentric manner.

9. The method of claim 8, wherein the light beam formed by the light that is emitted by the second group of the dies passing through the primary optical lens has a projection angle greater than that of the light beam formed by the light that is emitted by the first group of the dies passing through the primary optical lens.

10. The method of claim 7, wherein the dies are arranged in a rectangular shape, wherein the first group of the dies are disposed at a center of the substrate, and the second group of the dies are arranged in a ring enclosing the first group of the dies.

11. The method of claim 10, wherein the light beam formed by the light that is emitted by the second group of the dies passing through the primary optical lens has a projection angle greater than that of the light beam formed by the light that is emitted by the first group of the dies passing through the primary optical lens.

12. The method of claim 7, wherein the controlling unit controls light intensities of the dies so as to adjust a light effect of the light-emitting diode.

\* \* \* \* \*